United States Patent
Khoshakhlagh et al.

(10) Patent No.: US 9,214,581 B2
(45) Date of Patent: Dec. 15, 2015

(54) BARRIER INFRARED DETECTORS ON LATTICE MISMATCH SUBSTRATES

(71) Applicant: California Institute of Technology, Pasadena, CA (US)

(72) Inventors: Arezou Khoshakhlagh, Pasadena, CA (US); David Z Ting, Arcadia, CA (US); Sarath D. Gunapala, Stevenson Ranch, CA (US); Cory J. Hill, Chesterfield, MO (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 13 days.

(21) Appl. No.: 14/178,133

(22) Filed: Feb. 11, 2014

(65) Prior Publication Data

US 2014/0225064 A1    Aug. 14, 2014

Related U.S. Application Data

(60) Provisional application No. 61/763,189, filed on Feb. 11, 2013, provisional application No. 61/845,257, filed on Jul. 11, 2013.

(51) Int. Cl.
| | |
|---|---|
| *H01L 31/00* | (2006.01) |
| *H01L 31/0352* | (2006.01) |
| *H01L 31/0304* | (2006.01) |

(Continued)

(52) U.S. Cl.
CPC .... *H01L 31/035236* (2013.01); *H01L 21/0237* (2013.01); *H01L 21/02395* (2013.01); *H01L 21/02463* (2013.01); *H01L 21/02466* (2013.01); *H01L 21/02507* (2013.01); *H01L 21/02546* (2013.01); *H01L 21/02549* (2013.01); *H01L 31/03046* (2013.01); *H01L 31/101* (2013.01); *H01L 31/1844* (2013.01); *H01L 31/1852* (2013.01)

(58) Field of Classification Search
None
See application file for complete search history.

(56) References Cited

U.S. PATENT DOCUMENTS

| | | | |
|---|---|---|---|
| 4,679,063 | A  | 7/1987 | White |
| 6,226,152 | B1 | 5/2001 | Tanaka et al. |

(Continued)

FOREIGN PATENT DOCUMENTS

| | | |
|---|---|---|
| WO | 2005004243 | 1/2005 |
| WO | 2008061141 | 5/2008 |

OTHER PUBLICATIONS

Byun et al., "Heterojunction fabrication by selective area chemical vapor deposition induced by synchrotron radiation", Appl. Phys. Lett, Apr. 11, 1994, vol. 64, No. 15, pp. 1968-1970.

(Continued)

*Primary Examiner* — Benjamin Sandvik
*Assistant Examiner* — Herve Assouman
(74) *Attorney, Agent, or Firm* — KPPB LLP

(57) ABSTRACT

Systems and methods of implementing barrier infrared detectors on lattice mismatched substrates are provided. The barrier infrared detector systems combine an active detector structure (e.g., contact/barrier/absorber pairs) with a non-lattice matched substrate through a multi-layered transitional structure that forms a virtual substrate that can be strain balanced with the detector structure. The transitional metamorphic layer may include one or both of at least one graded metamorphic buffer layer or interfacial misfit array (IMF). A further interfacial layer may be interposed within the transitional structure, in some embodiments this interfacial layer includes at least one layer of AlSb.

16 Claims, 14 Drawing Sheets

(51) Int. Cl.
  *H01L 31/18* (2006.01)
  *H01L 31/101* (2006.01)
  *H01L 21/02* (2006.01)

(56) References Cited

U.S. PATENT DOCUMENTS

| | | | |
|---|---|---|---|
| 6,433,354 | B1 | 8/2002 | Kuan et al. |
| 6,455,908 | B1 | 9/2002 | Johnson et al. |
| 7,442,599 | B2 | 10/2008 | Maa et al. |
| 7,633,083 | B2 * | 12/2009 | Lester et al. ............ 257/20 |
| 7,687,871 | B2 | 3/2010 | Maimon |
| 7,795,640 | B2 | 9/2010 | Klipstein |
| 7,928,473 | B2 | 4/2011 | Klipstein |
| 8,022,390 | B1 | 9/2011 | Kim et al. |
| 8,217,480 | B2 | 7/2012 | Ting et al. |
| 8,410,523 | B2 | 4/2013 | Huffaker et al. |
| 2007/0215900 | A1 | 9/2007 | Maimon |
| 2008/0111152 | A1 | 5/2008 | Scott et al. |
| 2009/0127462 | A1 | 5/2009 | Gunapala et al. |
| 2009/0224228 | A1 * | 9/2009 | Razeghi ............ 257/21 |
| 2009/0256231 | A1 | 10/2009 | Klipstein |
| 2010/0006822 | A1 | 1/2010 | Ting et al. |
| 2010/0072514 | A1 | 3/2010 | Ting et al. |
| 2010/0155777 | A1 * | 6/2010 | Hill et al. ............ 257/184 |
| 2010/0230720 | A1 | 9/2010 | Wicks |
| 2011/0037097 | A1 | 2/2011 | Scott et al. |
| 2012/0145996 | A1 | 6/2012 | Ting et al. |
| 2013/0062593 | A1 | 3/2013 | Jones et al. |
| 2013/0146998 | A1 | 6/2013 | Ting et al. |

OTHER PUBLICATIONS

Gautam et al., "Performance improvement of longwave infrared photodetector based on type-II InAs/GaSb superlattices using unipolar current blocking layers", Applied Physics Letters, 2010, vol. 96, pp. 231107-1-231107-3.

Ghosh et al., "Fabrication of the SnS/ZnO heterojunction for PV applications using electrodeposited ZnO films", Semicond. Sci. Technol., 2009, vol. 24, pp. 025024-1-025024-7.

Gotoh et al., "Molecular Beam Epitaxy of AlSb on GaAs and GaSb on AlSb Films", Phys. Stat. Sol., 1983, vol. 75, pp. 641-645.

Hill et al., "Demonstration of large format mid-wavelength infrared focal plane arrays based on superlattice and BIRD detector structures", Infrared Physics & Technology, 2009, vol. 52, pp. 348-352.

Huang et al., "Strain relief by periodic misfit arrays for low defect density GaSb on GaAs", Applied Physics Letters, 2006, vol. 88, pp. 131911-1-131911-3.

Kazzi et al., "Interplay between Sb flux and growth temperature during the formation of GaSb islands on GaP", Journal of Applied Physics, 2012, vol. 111, pp. 123506-1-123506-5.

Kim et al., "Mid-IR focal plane array based on type-II InAs/GaSb strain layer superlattice detector with nBn design", Applied Physics Letters, 2008, vol. 92, pp. 183502-1-183502-3.

Klipstein, ""XBn" Barrier Photodetectors for High Sensitivity and High Operating Temperature Infrared Sensors", Proc. of SPIE, 2008, vol. 6940, pp. 69402U-1-69402U-12.

Lackner et al., "Growth of InAsSb/InAs MQWs on GaSb for mid-IR photodetector applications", Journal of Crystal Growth, 2009, vol. 311, pp. 3563-3567.

Lackner et al., "InAsSb and InPSb Materials for Mid Infrared Photodetectors", Proceedings, 2010, IPRM, 4 pgs.

Lackner et al., "Strain balanced InAs/InAsSb superlattice structures with optical emission to 10 um", Applied Physics Letters, 2009, vol. 95, pp. 081906-1-081906-3.

Magden, "Effects of Strain Release via Interfacial Misfit Arrays on the Optical Properties of GaSb/GaAs Heterojunctions", Senior Honors Thesis, 2012, 59 pgs.

Maimon et al., "nBn detector, an infrared detector with reduced dark current and higher operating temperatures", Applied Physics Letters, 2006, vol. 89, 1511091-1511093.

Plis et al., "Lateral diffusion of minority carriers in InAsSb-based nBn detectors", Applied Physics Letters, 2010, vol. 97, pp. 123503-1-123503-3.

Reyner et al., "Characterization of BaSb/GaAs interfacial misfit arrays using x-ray diffraction", Applied Physics Letters, 2011, vol. 99, pp. 231906-1-231906-3.

Tatebayashi et al., "Monolithically Integrated III-Sb-Based Laser Diodes Grown on Miscut Si Substrates", IEEE Journal of Selected Topics in Quantum Electronics, May/Jun. 2009, vol. 15, No. 3, pp. 716-723.

Ting et al., "A high-performance long wavelength superlattice complementary barrier infrared detector", Applied Physics Letters, 2009, vol. 95, pp. 023508-1-023508-3.

Wang et al., "Strain relief at the GaSb/GaAs interface versus substrate surface treatment and AlSb interlayers thickness", Journal of Applied Physics, 2011, vol. 109, pp. 023509-1-023509-6.

Weiss et al., "InAsSb-based XBnn bariodes grown by molecular beam epitaxy on GaAs", Journal of Crystal Growth, 2012, vol. 339, pp. 31-35.

Zhou et al., "Molecular Beam Epitaxy of GaSb on GaAs Substrates with AlSb Buffer Layers", Chin. Phys. Lett., 2009, vol. 26, No. 1, pp. 01810-1-01810-3.

* cited by examiner

US 9,214,581 B2

BARRIER INFRARED DETECTORS ON LATTICE MISMATCH SUBSTRATES

STATEMENT OF RELATED APPLICATIONS

The present application claims priority to U.S. Provisional Patent Application No. 61/763,189, filed Feb. 11, 2013 and U.S. Provisional Patent Application No. 61/845,257, filed Jul. 11, 2013, the disclosures of both of which are incorporated herein by reference.

STATEMENT OF FEDERAL FUNDING

The invention described herein was in the performance of work under a NASA contract, and is subject to the provisions of Public Law 96-517 (35 USC 202) in which the Contractor has elected to retain title.

FIELD OF THE INVENTION

The present invention generally relates to a barrier infrared detectors, and more particularly to systems and methods of forming barrier infrared detectors on lattice-mismatched substrates.

BACKGROUND OF THE INVENTION

High performance and low cost are often the main driving forces for determining whether a particular technology will enjoy widespread adoption. Over the past few years, superlattice (SL) technology operating in the mid-and long-wavelength infrared has progressed significantly, demonstrating the potential for realization of high performance infrared sensor materials. In particular, the type II SL material system has been identified as particularly promising for infrared detection as its cut-off wavelength can span a broad spectrum from mid-wavelength infrared (MWIR) to very long-wavelength infrared (VLWIR) (3 µm<$\lambda$<30 µm) by engineering the layer thicknesses. The major advantage of the SL material for IR detection applications is that it is a mechanically robust III-V material platform, which offers all the advantages of the III-V material system and is capable of normal incidence absorption, and therefore has high quantum efficiency.

More recently, barrier infrared detector (BIRD) designs such as the nBn device design (Maimon and Wicks, Appl. Phys. Lett., vol. 89, no. 15, p. 151109, 2006, the disclosure of which is incorporated herein by reference) have enhanced the performance of superlattices in the MWIR region by reducing the Shockley-Read-Hall (SRH) associated dark currents. Elaboration of these nBn design have shown the superiority of these barrier devices for MWIR (U.S. Pat. No. 8,217,480 B2, the disclosure of which is incorporated herein by reference), and LWIR (Ting et al., Appl. Phys. Lett. 95, 023508 (2009), the disclosure of which is incorporated herein by reference).

Despite the promise offered by SL technology and BIRD device designs more specifically, there are substantial barriers to the commercial fabrication of these infrared imagers.

SUMMARY OF THE INVENTION

In accordance with embodiments, systems and methods of implementing barrier infrared detectors on lattice mismatched substrates are provided.

In many embodiments, the invention is directed to an infrared photodetector including:
- a substrate formed of a substrate material having a substrate lattice constant;
- an infrared barrier detector structure including at least one absorber superlattice and at least one contact layer, and at least one unipolar barrier layer disposed between said at least one absorber layer superlattice and said contact layer, the detector structure having a detector lattice constant, wherein the substrate and detector lattice constants are mismatched such that the substrate and detector cannot be strain balanced; and
- a transitional structure disposed between the substrate and the detector structure, wherein the transitional structure forms a virtual substrate having a lattice constant that is pseudomorphic to the detector lattice constant.

In other embodiments, the substrate is a material selected from the group consisting of Si, GaAs, Ge, InAs, GaP, and InP.

In still other embodiments, the detector superlattice comprises alternating layers of InAs and InAsSb. In some such embodiments, the detector superlattice further includes a material selected from the group consisting of AlSb, AlAsSb, AlAs, and GaSb.

In yet other embodiments, the transitional structure is at least formed of GaSb.

In still yet other embodiments, the transitional structure is formed from at least one of an interfacial misfit array, a compositionally graded metamorphic buffer layer, and a superlattice metamorphic buffer layer. In some such embodiments, the transitional structure further comprises a template layer formed adjacent the detector structure, the transitional structure formed from a material having a lattice constant strain balanced to the lattice constant of the detector structure. In still other such embodiments, the template layer comprises a material selected from the group consisting of GaSb, GaAsSb, GaInSb, InGaAs, or InAsSb. In yet other such embodiments, the transitional structure includes an interfacial smoothing layer disposed within the transitional structure adjacent the template layer. In still yet other such embodiments, the interfacial smoothing layer includes at least one layer of AlSb.

In other embodiments the invention is directed to an infrared photodetector including:
- a substrate formed of at least one material selected from the group consisting of Si, GaAs, Ge, InAs, GaP, and InP;
- an infrared barrier detector structure including at least one absorber superlattice formed from alternating layers of InAs and InAsSb, at least one contact layer, and at least one unipolar barrier layer disposed between said at least one absorber layer superlattice and said contact layer, the detector structure having a detector lattice constant; and
- a transitional structure disposed between the substrate and the detector structure, the transitional structure including GaSb, such that the transitional structure forms a virtual GaSb substrate having a lattice constant that is strain balanced to the detector lattice constant.

In some such embodiments, the transitional structure is formed from at least one of an interfacial misfit array, a compositionally graded metamorphic buffer layer, and a superlattice metamorphic buffer layer. In some such embodiments, the transitional structure further includes a template layer formed adjacent the device structure, the template layer being formed from GaSb. In still other such embodiments, the transitional structure further includes an AlSb interfacial smoothing layer disposed within the transitional structure adjacent the GaSb template layer.

In other embodiments, the detector superlattice further includes a material selected from the group consisting of AlSb, AlAsSb, AlAs, and GaSb.

In yet other embodiments the invention is directed to a method of forming an infrared photodetector including:
  providing a substrate selected from at least one material from the group consisting of Si, GaAs, Ge, InAs, GaP, and InP;
  forming a transitional structure atop the substrate, the transitional structure including GaSb, such that the transitional structure forms a virtual GaSb substrate having a virtual substrate lattice constant;
  forming an infrared barrier detector structure atop the transitional structure, the detector structure including at least one absorber superlattice formed from alternating layers of InAs and InAsSb, at least one contact layer, and at least one unipolar barrier layer disposed between said at least one absorber layer superlattice and said contact layer, the detector structure having a detector lattice constant; and
  wherein the virtual substrate lattice constant is pseudomorphic with the detector lattice constant.

In other embodiments the transitional structure is formed from at least one of an interfacial misfit array, a compositionally graded metamorphic buffer layer, and a superlattice metamorphic buffer layer. In some such embodiments, the transitional structure is formed with a template layer formed adjacent the device structure, the template layer being formed from GaSb. In still other such embodiments, the transitional structure is formed with an AlSb interfacial smoothing layer disposed within the transitional structure adjacent the GaSb template layer.

In yet other embodiments, the detector superlattice further includes a material selected from the group consisting of AlSb, AlAsSb, AlAs, and GaSb.

Additional embodiments and features are set forth in part in the description that follows, and will become apparent to those skilled in the art upon examination of the specification or may be learned by the practice of the disclosed subject matter. A further understanding of the nature and advantages of the present disclosure may be realized by reference to the remaining portions of the specification and data, which forms a part of this disclosure.

BRIEF DESCRIPTION OF THE DRAWINGS

These and other features and advantages of the present invention will be better understood by reference to the following detailed description when considered in conjunction with the accompanying figures and data, wherein.

Additional embodiments and features are set forth in part in the description that follows, and will become apparent to those skilled in the art upon examination of the specification or may be learned by the practice of the disclosed subject matter. A further understanding of the nature and advantages of the present disclosure may be realized by reference to the remaining portions of the specification and data, which forms a part of this disclosure.

DETAILED DESCRIPTION OF THE INVENTION

Turning to the drawings, systems and methods of implementing barrier infrared detectors on lattice mismatched substrates are provided. In many embodiments, the barrier infrared detector systems combine an active detector structure (e.g., contact/barrier/absorber pairs) with a non-lattice matched substrate through a multi-layered transitional structure that forms a virtual substrate that can be strain balanced with the detector structure. In some embodiments, the barrier infrared detector systems include barrier infrared detector active layers formed of superlattice structures, including, for example, InAs/InAsSb superlattices consisting of alternating layers of InAs and InAsSb. In many embodiments, these superlattice structures are paired with substrates that are lattice mismatched with the superlattice, including, for example, Si, Ge, GaAs, InAs, GaP, and InP. In other embodiments, interposed between the superlattice and the lattice mismatched substrates is a transitional structure, such as one or more transitional metamorphic buffer layers (including compositionally graded metamorphic buffer layers) and/or interfacial misfit array (IMF), and a relaxed template layer, that in combination form a virtual substrate having a lattice constant in closer alignment with the detector structure, such that the virtual substrate and detector can be strain balanced. In still other embodiments, a further interfacial smoothing layer is interposed between the metamorphic buffer layer/IMF and the template layer, in some embodiments this interfacial smoothing layer includes at least one layer of AlSb. The use of these alternate substrates of Si and GaAs provide the ability to manufacture cost-effective large format infrared imaging with type-II superlattices.

Background of Lattice Mismatched Infrared Barrier Detectors

Figure 1A:
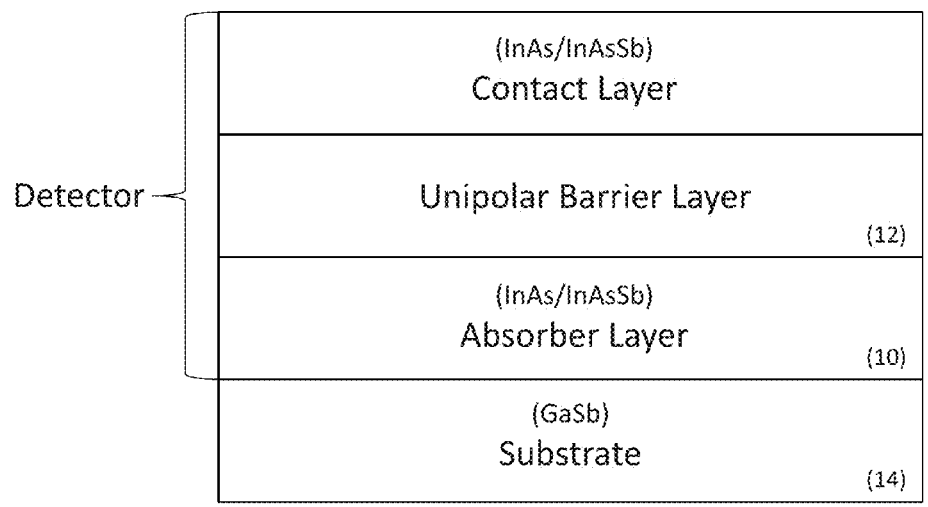
FIG. 1a schematically illustrates the structure of a conventional multi-layered barrier infrared detector.
Figure 1B:
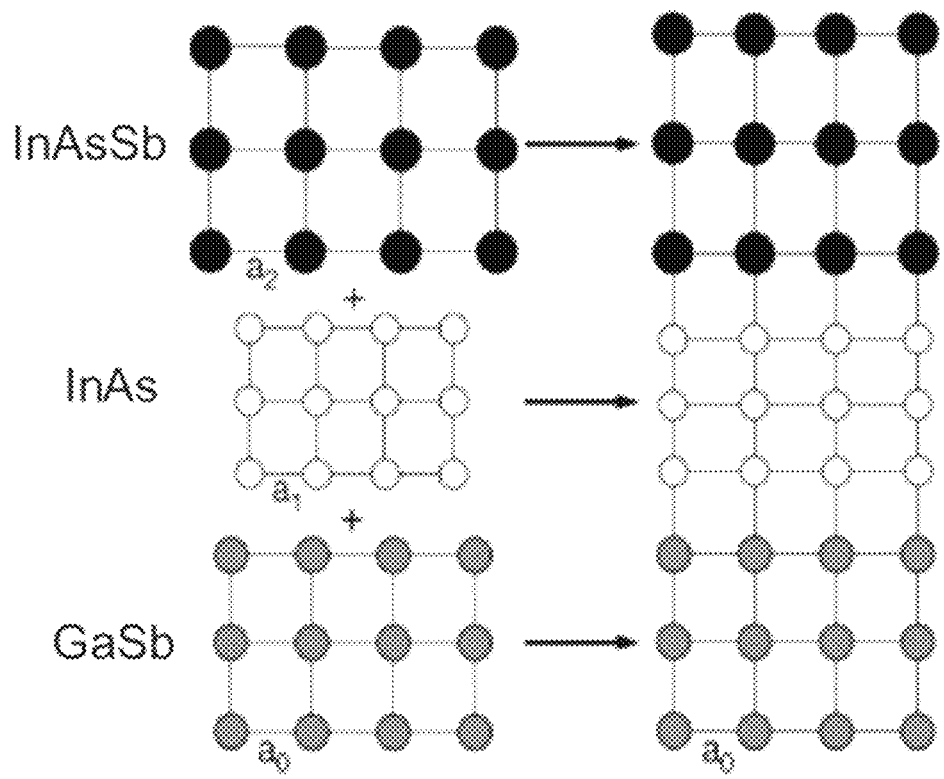
FIG. 1b schematically illustrates the lattice of a strain-balanced InAs/InAsSb structure grown pseudomorphically (coherently strained) on GaSb substrate.
Figure 1C:
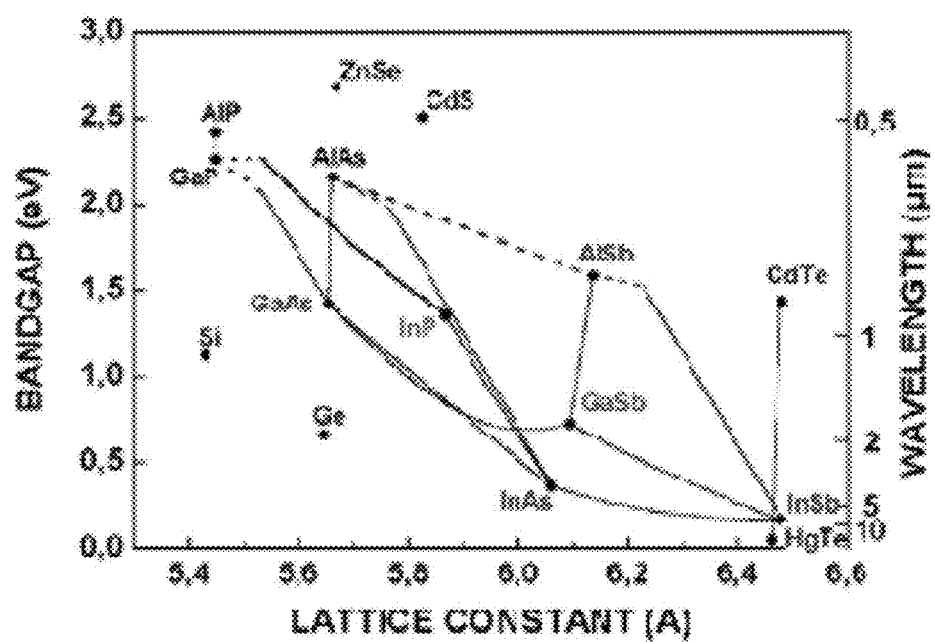
FIG. 1c provides the direct energy band gap plotted against the lattice constants for antimonides, arsenides, and arsenide-antimonide III-V semiconductors.

Currently, high performance type-II SL barrier infrared detector designs are grown on GaSb substrates. FIG. 1a, for example, provides a relevant example of a conventional barrier infrared detector design having superlattice infrared absorber(s) (10) paired with matching unipolar barrier(s) (12) that are grown atop a substrate (14). In one example, disclosed in Ting et al., U.S. Pat. No. 8,217,480 B2, the disclosure of which is incorporated herein by reference, barrier infrared detectors designed around InAs/InAsSb superlattice infrared absorbers grown pseudomorphically on GaSb substrates are provided. In this system the absorber superlattice structure is substantially strain-balanced with respect to the lattice constant of the GaSb substrate. Specifically, as shown in FIG. 1a, the InAs/InAsSb superlattice consists of alternating layers of InAs and InAsSb. In this system, the InAs has a smaller lattice constant than the GaSb substrates, and $InAs_xSb_{1-x}$ (with x<0.91) has a larger lattice constant than GaSb (as shown schematically in FIG. 1b). To minimize the strain energy (to achieve strain balancing) and to achieve the desired cutoff wavelength, the InAsSb alloy composition and the widths of InAs and InAsSb layers are adjusted. (In accordance with the compositional diagrams provided in FIG. 1c. Note in particular that the lattice constant of $InAs_xSb_{1-x}$ is smaller than that of GaSb for x>0.91, and larger for x<0.91.)

Although barrier infrared detectors based on GaSb have shown promise, the use of GaSb substrates limit the ability to form large format focal plane arrays, since the largest available size GaSb substrate is only four inches. Despite the fact that the GaSb substrate technology has made significant progress in the past few years, the substrates required for their growth have not yet reached the level of flatness and "epi-ready" condition necessary for reliable commercial production. Indeed, these GaSb substrates are frequently formed with non-optimized oxide layers and macroscopic surface defects. In addition, GaSb substrates have a cost five times that of GaAs and 10 times that of Si substrates. Moreover, the absorption coefficient of GaAs and Si are almost two orders of magnitude lower in the infrared regime as compared to GaSb substrates. Indeed, the higher absorption coefficient in GaSb requires complexities of substrate removal required for imaging applications. Another advantage associated with Si as compared with GaSb is that it is compatible with read out integrated circuits (ROICS) that are part of imaging technologies, which reduces the challenges presented by the different thermal expansion coefficients of Si ROICS and GaSb substrates.

While the desirability of using such "mature" substrates can be appreciated, the large mismatch leads to the mechanical strain in the detector structure, which results in the development of structural defects in the device structure. To create a high quality detector structure, it is necessary to reduce the lattice mismatch between the detector structure and the substrate. Some attempts have been made to address the lattice mismatch problems inherent in semiconductor devices by disposing them on virtual substrates. For example, Belenky et al. (US Patent Application Pub. No. US 2012/0223362 A1), discloses methods of growing of compound semiconductor devices on virtual substrates with GaInAsSb or GaInSb template layers to create a virtual substrate with a lattice constant that can transition from a GaSb substrate to the active semiconductor device. Despite the existence of such exemplary virtual substrate systems, they have not been widely adopted because such buffer/virtual substrates are known to introduce unwanted defects, such as threading dislocations. This can result in substantially higher defect density. The conventional view has been that higher defect density results in degraded device performance, and so these virtual systems have generally not been deemed optimal for device fabrication.

However, it has now been surprisingly discovered that the performance of infrared detectors based on superlattice infrared absorbers, and particularly InAs/InAsSb superlattice infrared absorbers, are not substantially degraded by the higher defect densities introduced when a structure is grown on virtual substrates atop lattice mismatched substrates. Indeed, experimental evidence has shown that, for the InAs/InAsSb superlattice structure specifically, defects introduced by lattice mismatch may be largely benign to detector performance because the defect energy levels tend to be in resonance with the conduction band, rather than deeper in the band gap where they can act as efficient non-radiative (Shockley-Read) generation-recombination centers. In addition, it has also been shown that some barrier detectors and focal plane arrays based on bulk infrared absorbers grown on a highly lattice mismatched substrates have shown dark current and responsivity performance levels that are comparable to the same structures grown on GaSb substrates, despite having approximately six orders of magnitude higher defect density. (See, e.g., E. Weiss et al., J. Crystal Growth 339 (2012) 31-35, the disclosure of which is incorporated herein by reference.)

In this respect, embodiments of the instant disclosure develop barrier infrared detector systems and methods for forming such barrier infrared detectors that take advantage of newly developed fabrication techniques and virtual substrate structures in combination with this relaxed sensitivity to defects to grow superlattice infrared absorbers on lattice mismatched substrates via a multilayer virtual substrate. In particular, in some embodiments the systems and methods use InAs/InAsSb superlattice barrier infrared detectors grown on GaSb virtual substrates such that substrates (such as Si and GaAs) lattice mismatched to the subject device lattice may be used. Accordingly, the barrier infrared detector technologies disclosed previously, such as, for example in U.S. Pat. No. 8,217,480 B2 by Ting et al., cited above, may be extended to include implementation on lattice-mismatched substrates. In particular, growth on GaAs and Si substrates should lower focal plane array production cost and increase yield.

Lattice Mismatched Barrier Infrared Detector Systems

Figure 2:
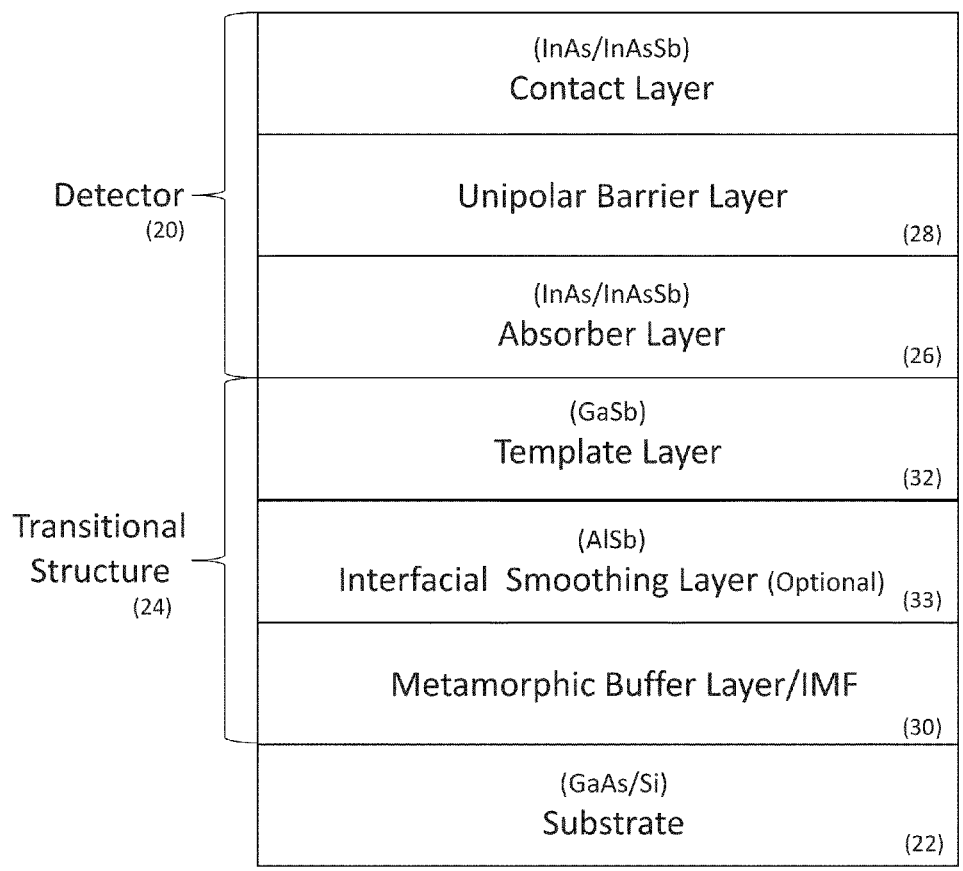
FIG. 2 schematically illustrates a barrier infrared detector structure grown on a lattice-mismatched substrate in accordance with various embodiments of the invention.

In embodiments, barrier infrared detectors are provided that are disposed on lattice-mismatched substrates (i.e., substrates having a lattice mismatch with reference to the device lattice constant large enough to prevent strain balancing between the substrate and the device). Although other lattice-mismatched materials might be incorporated into the systems and methods, exemplary substrate materials include Si, Ge, GaAs, InAs, GaP, and InP. As shown in FIG. 2, in many embodiments the barrier infrared detectors include three general structures: a detector structure (20), a substrate structure (22), and a transitional structure (24) interposed there between.

Turning to the specific nature of these general structures, in many embodiments the detector structure (20) includes superlattice infrared absorber(s) (26) paired with matching unipolar barrier(s) (28). In one specific embodiment, the absorber and unipolar barrier structures are formed as disclosed in U.S. Pat. No. 8,217,480 B2 (cited above). For example, some embodiments of the detector structure are formed of an InAs/InAsSb superlattice consisting of alternating layers of InAs and InAsSb, which make up, in some instances, one or more contact layers, one or more absorber layers, and one or more unipolar barrier layers. It should be understood that although this discussion will focus on these particular materials and on nBn type barrier infrared detectors, that the systems and methods for forming these detectors on lattice-mismatched substrates is generalizable to other material systems and to other types of barrier infrared detectors, including pBp type devices. Likewise, although this discussion will focus on the specific case of substrates formed from Si and GaAs, because of the maturity of these materials and their widespread availability and use, other suitable lattice mismatched substrates (22) can be incorporated into the barrier infrared detectors, including, for example, Ge, InAs, GaP, and InP.

Turning now to the transitional structure (24), it will be understood that a number of systems and methods may be used to pair a detector structure with a substrate. In some embodiments, the transitional structure includes one of at least a transitional metamorphic buffer layer of IMF (30) disposed on the substrate (e.g., GaAs, Si, etc.), followed by a relaxed "template" layer (32) (e.g., GaSb, GaAsSb, GaInSb, InGaAs, InAsSb, etc.) onto which the detector structure is grown. This transitional structure (24) combines to form a "virtual substrate" having the native lattice constant of the template layer, which is selected to have a different lattice constant to the substrate, and preferably that has a lattice constant that is more closely matched to that of the detector structure, such that the barrier infrared detector structure is pseudomorphic to the template layer (i.e., coherently strained to the template layer or virtual substrate lattice constant). By forming such a virtual substrate it is then possible to grow the barrier infrared detector structure in accordance with conventional techniques, such as those described by Ting et al. in U.S. Pat. No. 8,217,480 B2, cited above.

It will be understood that many different types of transitional structures may be used in embodiments of the barrier infrared detector systems. Exemplary transitional structures according to embodiments include metamorphic buffer layers and interfacial misfit arrays. Although many types of graded metamorphic buffer layers have been previously disclosed, in many embodiments the graded metamorphic layer may be formed from one or more layers that are compositionally graded to provide a transitional bridge between lattice constants of the substrate and the template layer in accord with the curves provided, for example, in FIG. 1b. Alternatively, the transitional structure may comprise a multi-layer structure, such as an interfacial misfit array (IMF). Such IMF structures typically involve the use of intentional and highly periodic edge dislocations at the junction interface between two layers. These periodic arrangements of dislocations ensure that unacceptable levels of stress, caused by the misfit or mismatch between the substrate and other layers of the device, do not build up in the device structure layers by relieving it immediately after the transition from the substrate. Such IMFs can be realized in a number of ways, such as, for example, by growing either the substrate or the growth layers such that they are formed with dangling bonds with a spatial period determined by the lattice constants of the interfacing materials, forming dislocations with radiation-based lithography, and electrodeposition of intermediate layers between the substrate and the epitaxial layer. (See, e.g., S. H. Huang, et al., *App Phys Lett*, vol 88, (2006) 131911; D. Byun, et al. *App. Phys. Lett.*, vol. 64, no. 15, (1994); Reyner, C. J., et al., Appl. Phys. Lett., vol. 99, 231906 (2011); Tatebayahsi, J., et al., IEEE J. of Selected Topics In Quantum Electronics, vol. 15, no. 3 (2009); and B. Ghosh, *Semiconductor Sci and Tech.*, vol. 24, no 2 (2009), the disclosures of each of which are incorporated herein by reference.)

Regardless of the specific design of the transitional structure, the layers are engineered and configured to allow for the growth of the template layer in a strain-balanced configuration such that defect density at the virtual substrate is minimized. It should be understood that the design of such transitional structures, and particularly the amount of misfit/mismatch between the lattice structure of any substrate and any device structure can be calculated, and thus the amount of strain release required can also be determined and the transitional structure thus suitably engineered. (See, e.g., E. S. Magden, "Effects of Strain Release Via Interfacial Misfit Arrays On The Optical Properties of GaSb/GaAs Heterojunctions", Chapter 4, Senior Honors Thesis, Tufts University (2012), the disclosure of which is incorporated herein by reference.)

As shown in FIG. 2, in some embodiments an optional interfacial smoothing layer (33) is provided within the transitional structure (24) between the metamorphic buffer layer/IMF (30) and the template layer (32). This interfacial smoothing layer may be made of any material suitable for reducing the defect density between the substrate and transitional structure. An exemplary interface smoothing layer may be formed, for example, of an AlSb material. As will be discussed in greater detail below, by engineering the thickness and growth conditions of such an interfacial smoothing layer it is possible to create an interfacial layer upon which the virtual substrate can be grown to minimize defect density.

Figure 3:
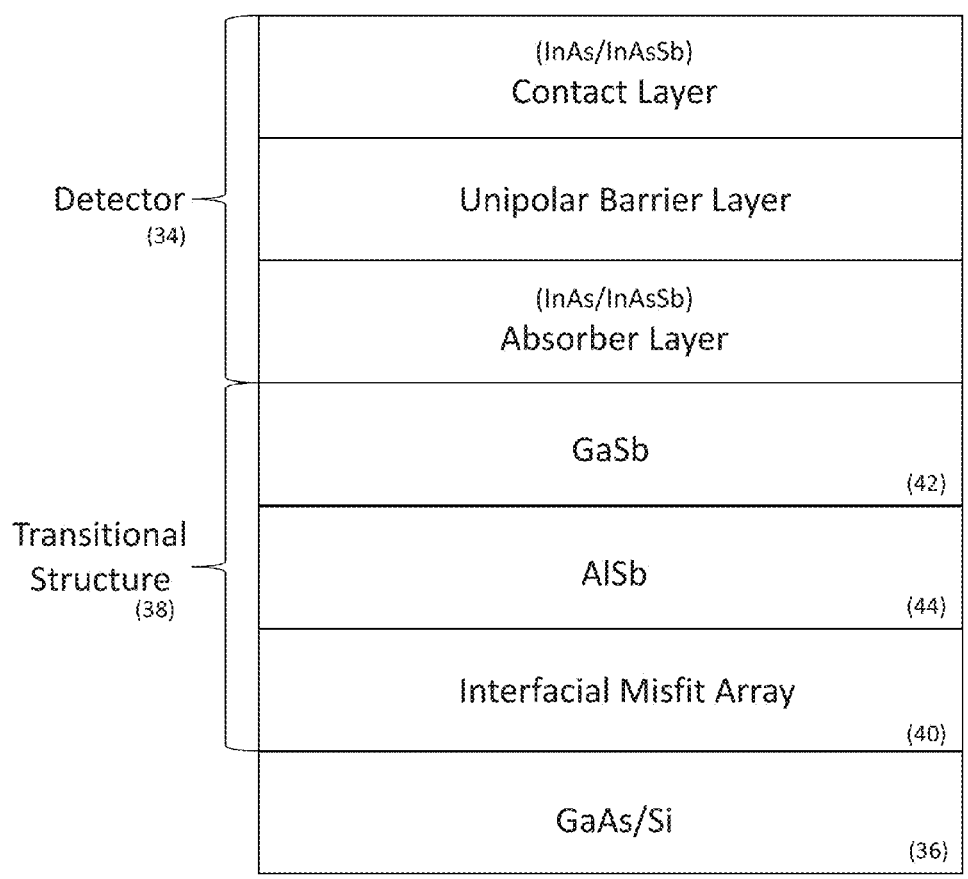
FIG. 3 schematically illustrates a barrier infrared detector structure grown on a lattice-mismatched substrate having a transitional metamorphic buffer layer and an interfacial smoothing layer in accordance with various embodiments of the invention.

An example of a barrier infrared detector device structure grown on a lattice-mismatch substrate in accordance with the embodiments of the invention is illustrated in FIG. 3. As shown in these embodiments an InAs/InAsSb superlattice consisting of alternating layers of InAs and InAsSb is used to form the detector structure (34). This detector structure is formed atop a substrate (36) of either GaAs or Si. A transitional structure (38) formed of an interfacial misfit array (40) and a GaSb template layer (42) is interposed between the detector and substrate. In addition, this embodiment further includes an interfacial-smoothing layer (44) formed of AlSb disposed between the IMF and the template layer.

Although specific embodiments of barrier infrared detector systems capable of buffering GaSb template layers atop lattice mismatched substrates, such as, for example, GaAs and Si have been described in reference to InAs/InAsSb superlattice detector structures, the systems and methods described herein could also be extended to other template layer materials, such as, for example, GaAsSb, GaInSb, InGaAs, or InAsSb. As will be understood by one skilled in the art, this flexibility allows for the extension of the systems and methods to alternative infrared absorber and barrier designs, by providing a continuous range of virtual substrate lattice constants that may be used to strain balance different infrared absorber/barrier designs and materials. For example, a GaInSb template with a somewhat larger lattice constant than GaSb, and an InAs/InAsSb superlattice infrared absorber that is strain balanced to the GaInSb lattice constant may be used.

Methods of Forming Lattice Mismatched Barrier Infrared Detectors

As discussed above, the lattice mismatch between the template layer of GaSb and the lattice mismatched substrate (e.g., GaAs or Si) (as described in FIG. 1a) presents growth challenges, which can lead to large dislocation densities that can degrade the device performance, despite the insensitivity of these superlattice infrared barrier detectors to defects in general. In order to achieve high performance infrared detectors on lattice mismatched substrate such as GaAs and Si, it is necessary to develop growth methods to accommodate the large lattice mismatch between the epi-layer and the substrate. Accordingly some embodiments are directed to methods of forming superlattice infrared barrier detectors on such lattice mismatched substrates.

Figure 4:
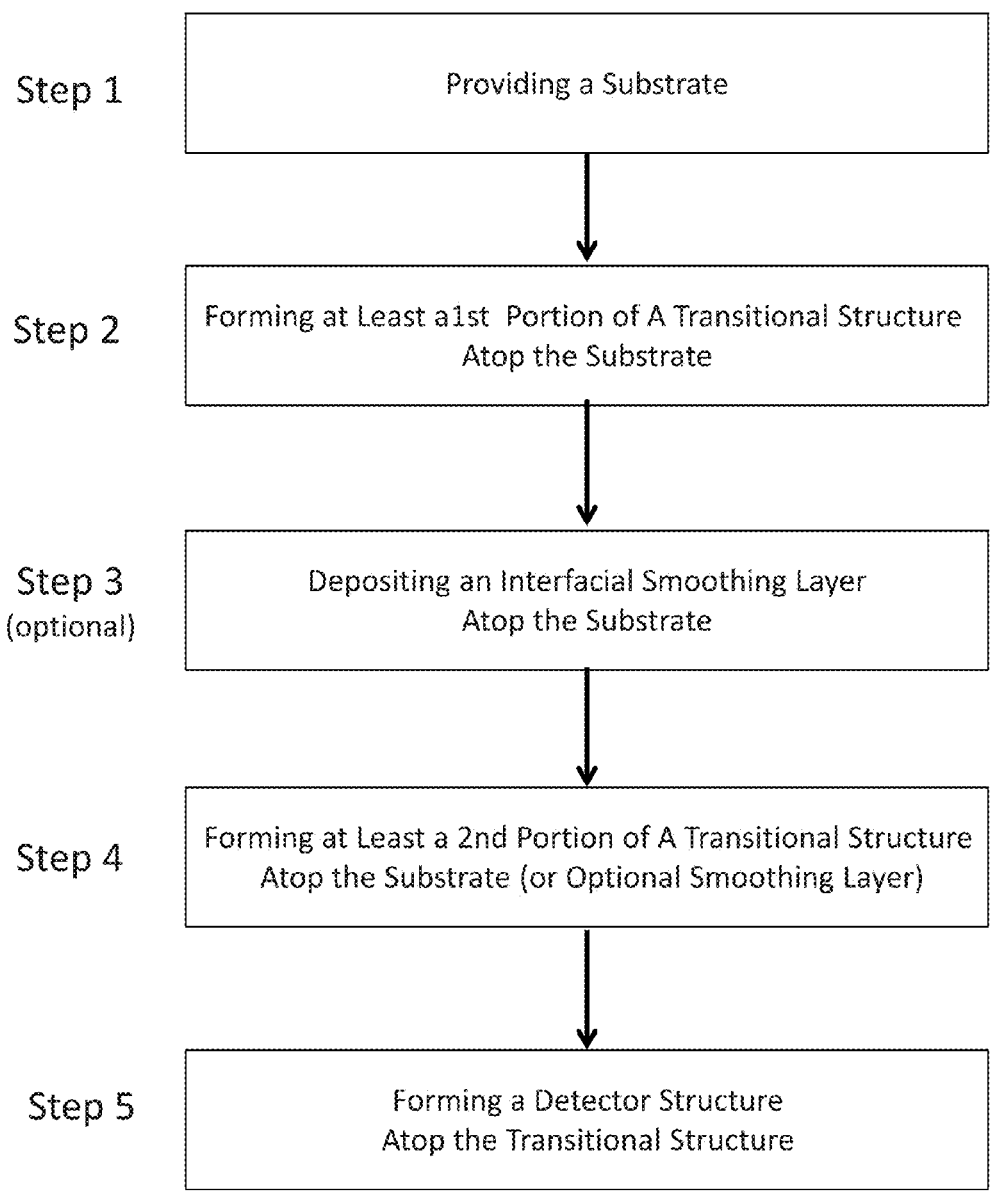
FIG. 4 provides a flowchart of a process for fabricating barrier infrared detectors formed atop lattice mismatched substrates in accordance with various embodiments of the invention.

FIG. 4 provides a flow chart of embodiments of a method of fabricating infrared barrier detector systems having superlattice detector structures paired with substrates that are lattice mismatched to the detector structure. As shown in the flow chart, the method includes the following general steps:

Providing a suitable lattice mismatched substrate, such as, for example, GaAs, Si, etc. (Step 1);

Forming a transitional structure atop the substrate and/or substrate and interfacial smoothing layer, the transitional structure having at least one of either a metamorphic buffer layer structure or an IMF (Step 2), and a template layer (Step 4) formed of a material having a lattice constant closer to that of the device structure to be formed than the substrate such that the device structure is pseudomorphic to the template layer (i.e., coherently strained to the template layer or virtual substrate lattice constant);

Optionally depositing an interfacial smoothing layer, such as, for example, AlSb atop the substrate (Step 3); and Forming a superlattice infrared barrier detector device structure atop the virtual substrate (Step 5).

In terms of the deposition techniques themselves, it should be understood that any method suitable for the crystal growth of compound semiconductor materials may be used. One exemplary family of methods that is suitable includes epitaxy methods, where a material is assembled atomically via the use of atomic sources that are deposited at the surface of a bulk substrate. There are a number of different epitaxy methods including liquid, gaseous, and atomic sources, Accordingly, there exist liquid sources, such as, for example, Liquid Phase Epitaxy (LPE); gaseous sources, such as for example, Vapor Phase Epitaxy (VPE) and Metal-Organic Vapor Phase Epitaxy, and atomic compositional methods, such as, for example, Molecular Beam Epitaxy (MBE), any one or more of which might suitably be used in association with the methods of the instant disclosure.

Specific examples and embodiments of infrared barrier detectors formed in accordance with these methods are described in greater detail below.

Exemplary Embodiments

The above general forming methodologies will be better understood with reference to the following examples, which are presented for the purposes of elucidation only, and are not to be taken as limiting the scope of the disclosure.

Example 1

Growth of MWIR SL Detectors on GaAs Substrates

Figure 5A:
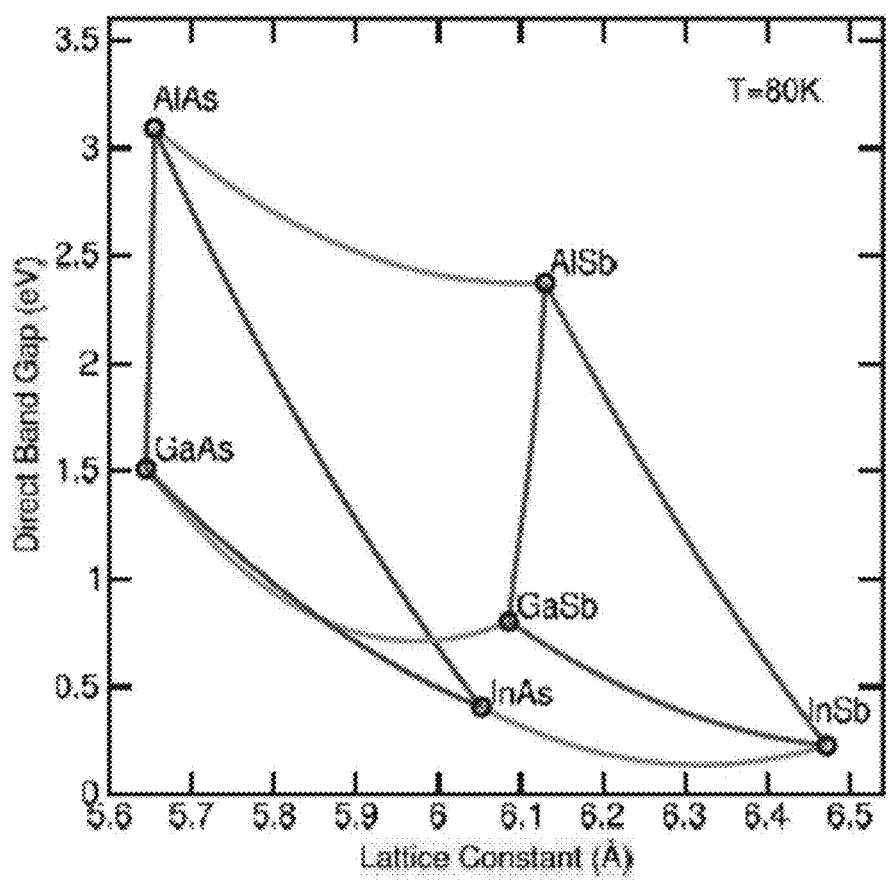
FIG. 5a provides a data graph of the band gap versus lattice constant for exemplary semiconductor materials.
Figure 5B:
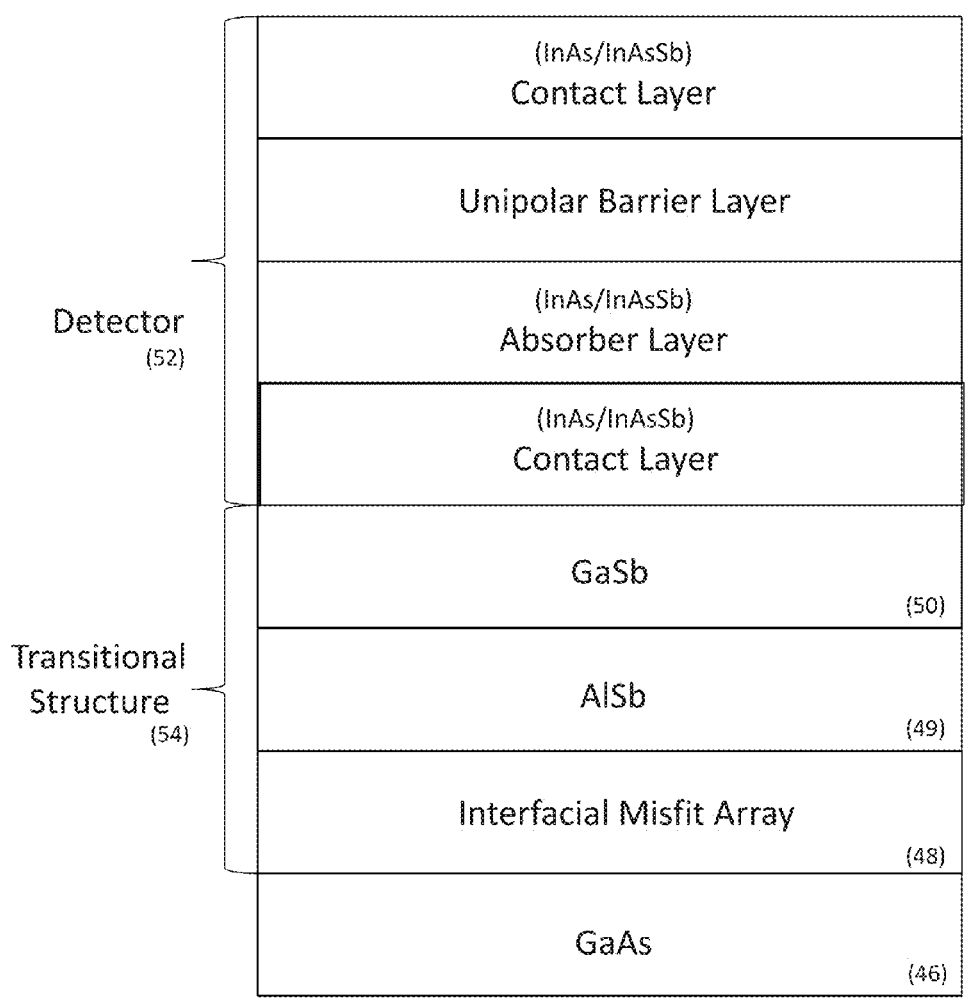
FIG. 5b schematically illustrates a barrier infrared detector structure grown on a lattice-mismatched GaAs substrate in accordance with various embodiments of the invention.

In an exemplary embodiment a MWIR superlattice barrier infrared detector was grown on a substrate of GaAs using a Gen-III MBE in accordance with the fabrication processes described above. FIG. 5a provides a graph of the bandgap versus lattice constant for the GaAs and GaSb semiconductor materials. As shown there is a large lattice mismatch (~7.8% between GaSb and GaAs as well as between GaSb and Si). As shown schematically in FIG. 5b, in this particular embodiment the device fabrication begins with the provision of a GaAs substrate (46)(for the purposes of the characterization a GaAs substrate will be discussed). Atop this substrate a GaSb material is deposited. At the interface between the GaSb and the substrate a misfit interface array transitional structure (48) is provided such that the lattice constant mismatch between the GaAs and GaSb is released immediately at the interface. As discussed above, the immediate release of the lattice mismatch is critical to prevent the dislocations caused by the mismatch from penetrating through to the detector structure. In this exemplary embodiment, an interfacial smoothing layer (49) was deposited atop the IMF. Atop this interfacial smoothing layer the deposition of the GaSb is continued such that a buffer layer and template layer of GaSb (50) is provided, which ultimately forms a virtual substrate transitional structure (54) of GaSb atop which the detector structure (52)(in this case a superlattice structure of InAs/InAsSb absorber, unipolar barrier and contact layers) is fabricated.

Figure 6A:
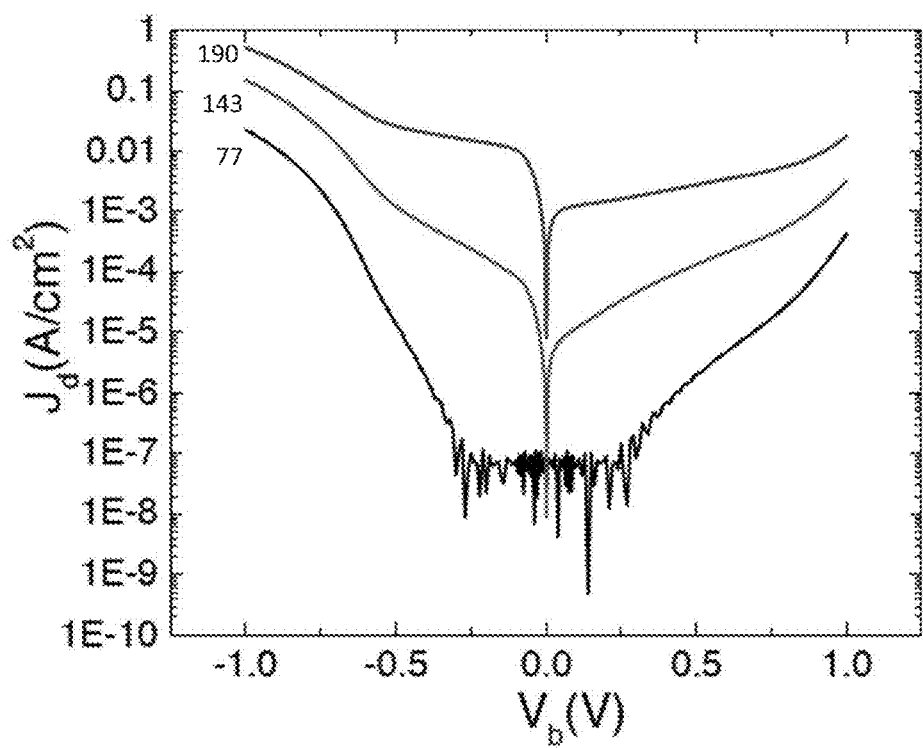
FIG. 6a provides a data graph plotting the dark current density versus voltage bias for a hot midwave barrier detector formed on a GaAs substrate.
Figure 6B:
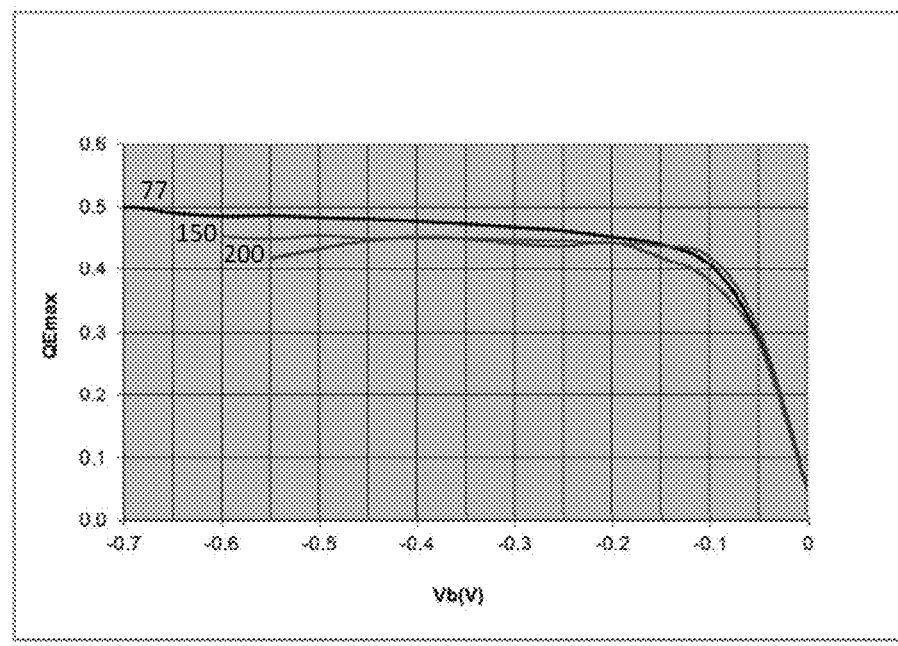
FIG. 6b provides a data graph plotting quantum efficiency versus voltage bias for a hot midwave barrier detector formed on a GaAs substrate.
Figure 6C:
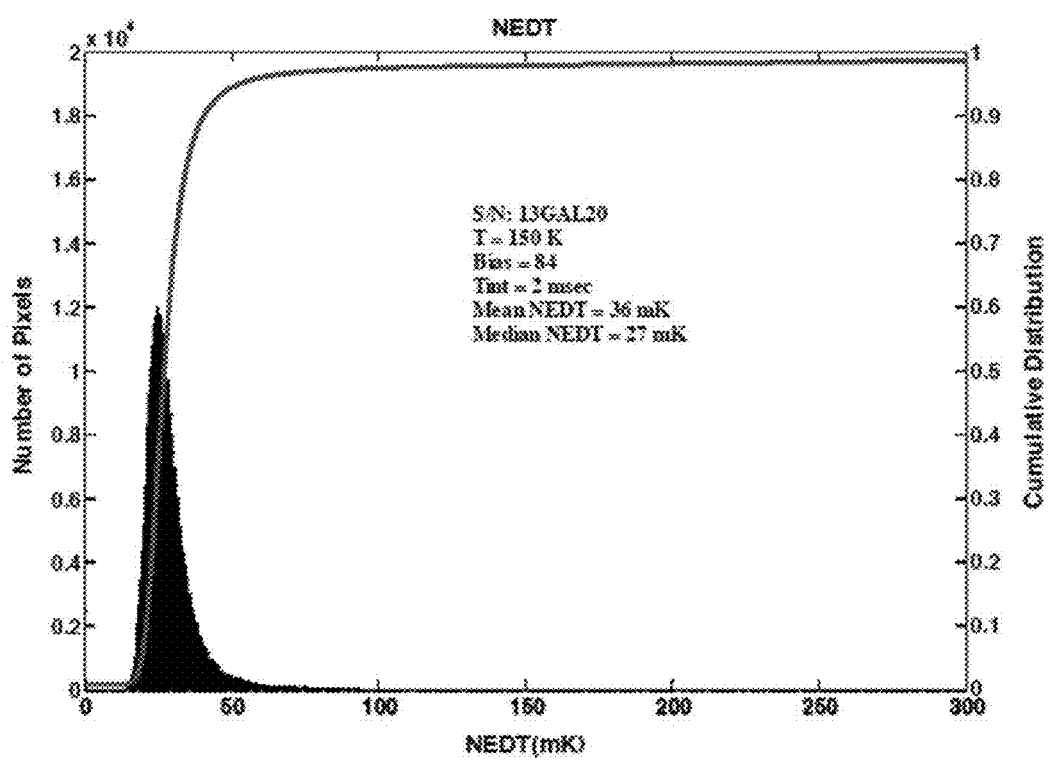
FIG. 6c provides a data graph plotting the focal plane array median noise equivalent differential temperature at 150 K.
Figure 6D:
FIG. 6d provides an image produced from a hot midwave detector formed on a GaAs substrate in accordance with embodiments of the invention.

These embodiments of the barrier infrared detector grown on GaAs were processed for both single pixel and focal plane array (FPA) characterization at three temperatures 77, 143 and 190° C. FIGS. 6a and 6b show the characterization of a single pixel array, and FIGS. 6c and 6d show the characterization of a focal plane array. FIG. 6a indicates that a single pixel array detector device made in accordance with embodiments have a dark current density of 8.3E-5 A/cm$^2$, while FIG. 6b shows a QE of % 45 at 100 mV. The same sample was then processed into an array of detectors. The focal array characterization results show a median (NEDT) of 27 mK at 150 K as shown in FIG. 6c. Finally, FIG. 6d provides a two-point corrected image of a hot midwave barrier detector formed on GaAs substrate in accordance with the structure and methods shown in FIGS. 5a and 5b. In summary, both the single pixel and focal plane array results show that barrier detectors formed on lattice mismatched substrates in accordance with embodiments demonstrate performance metrics comparable to conventional infrared detectors grown on traditional substrates.

Example 2

Comparison of SL Detectors with and without an Interfacial Smoothing Layer

In another exemplary embodiment a comparison study was conducted to determine the effect of the interposition of an interfacial smoothing layer between the substrate and the transitional structure. To perform the comparison two samples were formed in accordance with the following techniques:

In a first method no interfacial smoothing layer was deposited. In such a method a sample of GaAs is formed and then cooled under an Sb2 flux. This is then followed by the direct growth of GaSb atop the substrate using a transitional structure comprised of an IMF array. However this system resulted in an infrared InAs/InAsSb barrier detector having relatively low crystalline quality. As a result, a relatively broad X-ray peak as well as a low photoluminescence peak was measured from this sample (results no provided).

Figure 7A:
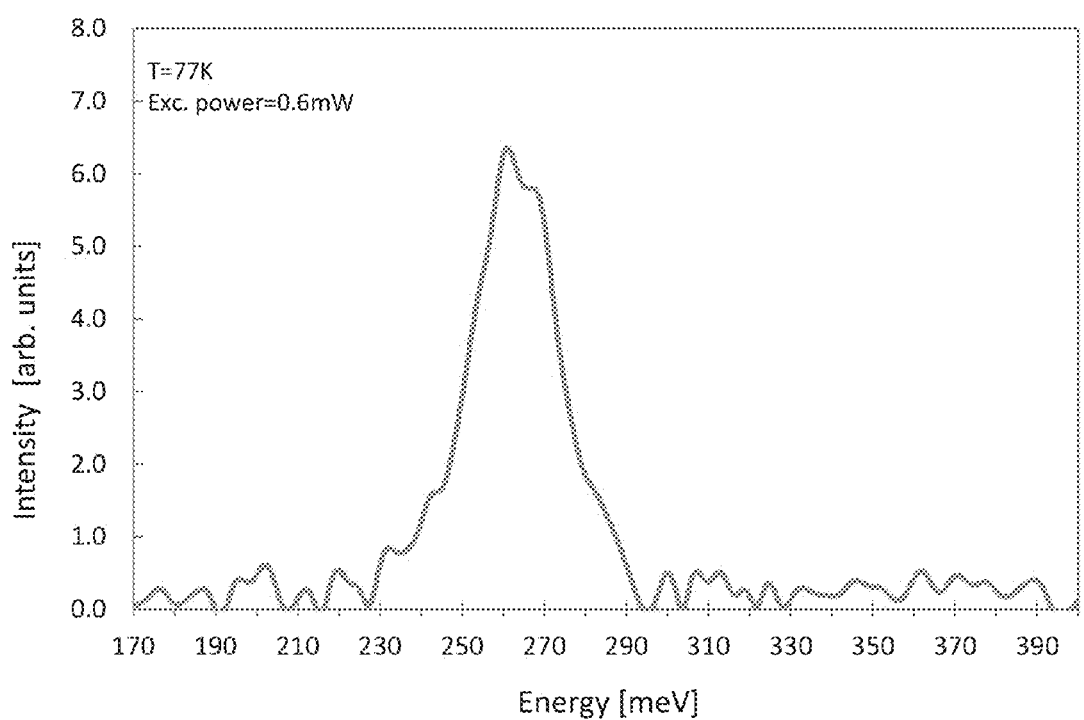
FIG. 7a provides a data graph of the photoluminescence of an InAs/InAsSb barrier IR detector on a GaAs substrate in accordance with embodiments of the invention.
Figure 7B:
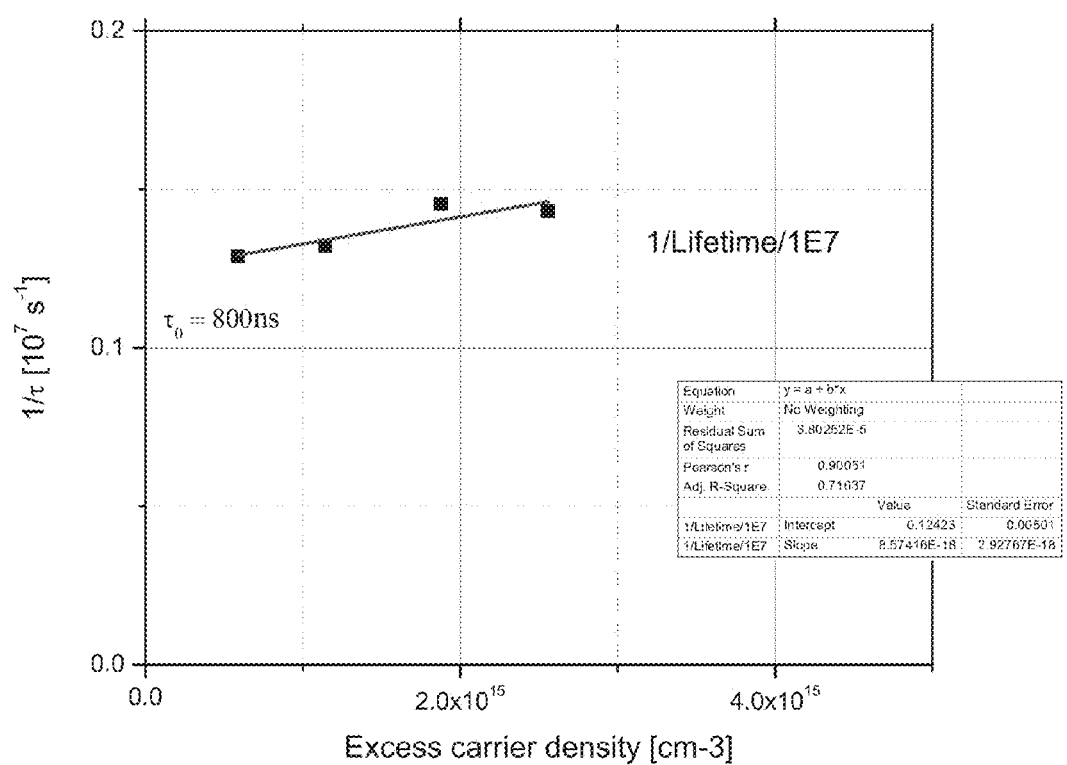
FIG. 7b provides a data graph of the minority carrier lifetime of an InAs/InAsSb barrier IR detector on GaAs substrate in accordance with embodiments of the invention.

In a second method an interfacial smoothing layer was deposited between the IMF and template layers of the transitional structure. In such a method a sample of GaAs is formed, followed by an IMF, which was then cooled under an Sb2 flux. Atop this IMF an AlSb interfacial smoothing layer was deposited. Then a GaSb template layer was grown on top of this interfacial smoothing layer followed by the growth of a full structure InAs/InAsSb barrier infrared detector. As shown in FIGS. 7a and 7b, growth of the detector with the smoothing layer resulted in improved crystalline quality with a high photoluminescence peak (FIG. 7a) and a minority carrier lifetime of 800 ns (FIG. 7b). (It should be noted that the nature of the flux under which the substrate is cooled is a parameter which can affect the quality of the ultimate device. For example, in another embodiment the substrate was alternatively cooled down under an As2 flux followed with the growth of the AlSb interfacial smoothing layer. However, these devices showed a lower photoluminescence peak as compared to the method that used an Sb2 flux.) Examples of methods of forming such interfacial smoothing layers may be found in, for example, H. Gotoh, et al., Phys. Stat. Sol. 75, 641 (1983); Zhou, Zhi-Qiang, et al., Chin. Phys. Lett., 26, 018101 (2009); and S. El Kazzi, et al., J. Appl. Phys., 111 123506 (2012), the disclosures of which are incorporated herein by reference.

In embodiments barrier infrared detectors are provided that are disposed on lattice-mismatched substrates. Exemplary substrate materials include Si, Ge, GaAs, InAs, GaP, and InP. Each of these materials, and particularly GaAs and Si substrates have much higher maturity levels than GaSb substrates in terms of size (wafer diameter), flatness, and surface quality, as well as being lower in cost. Growth on substrates with better flatness facilitates the hybridization process between detector array and the readout integrated circuit (ROIC), and improves focal plane array (FPA) production yield. The larger substrate size allows more detector arrays to be processed at the same time and thereby lowers production cost. Si substrates in particular also offer the unique advantage of being made of the same material as the silicon-based ROIC, and therefore has the same thermal expansion coefficient as the ROIC; this then obviates the need for substrate removal, and further increases yield and lowers production cost. While this is expected to increase the defect density resulting from growth on lattice mismatched substrates, it has been discovered that such defects will not substantially degrade device performance. Indeed, forming barrier infrared detector on these GaAs and Si substrates in association with the transitional structures described can provide a break-through in the commercialization of III-V based detector technology.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. An infrared photodetector comprising:
   a substrate formed of a substrate material having a substrate lattice constant;
   an infrared barrier detector structure comprising at least one absorber superlattice and at least one contact layer, and at least one unipolar barrier layer disposed between said at least one absorber layer superlattice and said contact layer, the detector structure having a detector lattice constant, wherein the substrate and detector lattice constants are mismatched such that the substrate and detector cannot be strain balanced; and
   a transitional structure disposed between the substrate and the detector structure, wherein the transitional structure is formed from at least one of an interfacial misfit array, a compositionally graded metamorphic buffer layer, and a superlattice metamorphic buffer layer;
   wherein the transitional structure further comprises a template layer formed adjacent the detector structure, wherein the template layer is formed from a material having a lattice constant strain balanced to the lattice constant of the detector structure; and
   wherein the transitional structure forms a virtual substrate having a lattice constant that is pseudomorphic to the detector lattice constant.

2. The infrared detector of claim 1, wherein the substrate is a material selected from the group consisting of Si, GaAs, Ge, InAs, GaP, and InP.

3. The infrared detector of claim 1, wherein the detector superlattice comprises alternating layers of InAs and InAsSb.

4. The infrared detector of claim 3, wherein the detector superlattice further comprises a material selected from the group consisting of AlSb, AlAsSb, AlAs, and GaSb.

5. The infrared detector of claim 1, wherein the transitional structure is at least formed of at least one of AlSb or GaSb.

6. The infrared detector of claim 1, wherein the template layer comprises a material selected from the group consisting of GaSb, GaAsSb, GaInSb, InGaAs, or InAsSb.

7. The infrared detector of claim 1, wherein the transitional structure further comprises an interfacial smoothing layer disposed within the transitional structure adjacent the template layer.

8. The infrared detector of claim 7, wherein the interfacial smoothing layer comprises at least one layer of AlSb.

9. An infrared photodetector comprising:
   a substrate formed of at least one material selected from the group consisting of Si, GaAs, Ge, InAs, GaP, and InP;
   an infrared barrier detector structure comprising at least one absorber superlattice formed from alternating layers of InAs and InAsSb, at least one contact layer, and at least one unipolar barrier layer disposed between said at least one absorber layer superlattice and said contact layer, the detector structure having a detector lattice constant; and
   a transitional structure disposed between the substrate and the detector structure, the transitional structure comprising GaSb, such that the transitional structure forms a virtual GaSb substrate having a lattice constant that is strain balanced to the detector lattice constant, the transitional structure comprising a template layer formed adjacent the detector structure, wherein the transitional structure is formed from a material having a lattice constant strain balanced to the lattice constant of the detector structure, wherein the transitional structure is formed from at least one of an interfacial misfit array, a compositionally graded metamorphic buffer layer, and a superlattice metamorphic buffer layer.

10. The infrared detector of claim 9, wherein the template layer is formed from GaSb.

11. The infrared detector of claim 10, wherein the transitional structure further comprises an AlSb interfacial smoothing layer disposed within the transitional structure adjacent the GaSb template layer.

12. The infrared detector of claim 9, wherein the detector superlattice further comprises a material selected from the group consisting of AlSb, AlAsSb, AlAs, and GaSb.

13. A method of forming an infrared photodetector comprising:
  providing a substrate selected from at least one material from the group consisting of Si, GaAs, Ge, InAs, GaP, and InP;
  forming a transitional structure atop the substrate, the transitional structure comprising GaSb, such that the transitional structure forms a virtual GaSb substrate having a virtual substrate lattice constant, the transitional structure comprising a template layer formed adjacent the detector structure, wherein the transitional structure is formed from a material having a lattice constant strain balanced to the lattice constant of the detector structure, wherein the transitional structure is formed from at least one of an interfacial misfit array, a compositionally graded metamorphic buffer layer, and a superlattice metamorphic buffer layer;
  forming an infrared barrier detector structure atop the transitional structure, the detector structure comprising at least one absorber superlattice formed from alternating layers of InAs and InAsSb, at least one contact layer, and at least one unipolar barrier layer disposed between said at least one absorber layer superlattice and said contact layer, the detector structure having a detector lattice constant; and
  wherein the virtual substrate lattice constant is pseudomorphic with the detector lattice constant.

14. The method of claim 13, wherein the template layer is formed from GaSb.

15. The method of claim 14, wherein the transitional structure is formed with an AlSb interfacial smoothing layer disposed within the transitional structure adjacent the GaSb template layer.

16. The method of claim 13, wherein the detector superlattice further comprises a material selected from the group consisting of AlSb, AlAsSb, AlAs, and GaSb.

* * * * *